United States Patent
Shako et al.

(10) Patent No.: US 7,418,057 B2
(45) Date of Patent: Aug. 26, 2008

(54) DISTORTION COMPENSATING APPARATUS, COMPRESSED DATA GENERATING METHOD

(75) Inventors: Hideharu Shako, Yokohama (JP); Yasuhito Funyu, Kawasaki (JP); Takeshi Ohba, Yokosuka (JP)

(73) Assignee: Fujitsu Limited, Kawasaki (JP)

( * ) Notice: Subject to any disclaimer, the term of this patent is extended or adjusted under 35 U.S.C. 154(b) by 535 days.

(21) Appl. No.: 11/113,043

(22) Filed: Apr. 25, 2005

(65) Prior Publication Data
US 2006/0029155 A1    Feb. 9, 2006

(30) Foreign Application Priority Data
Aug. 4, 2004    (JP)    ............................. 2004-227511

(51) Int. Cl.
*H04L 25/49*    (2006.01)
(52) U.S. Cl. ..................................... 375/296
(58) Field of Classification Search ................ 332/117, 332/149, 123–125, 159–161; 375/295, 296, 375/297; 455/91, 114.2
See application file for complete search history.

(56) References Cited

U.S. PATENT DOCUMENTS

| | | | | |
|---|---|---|---|---|
| 5,404,378 A | * | 4/1995 | Kimura | 375/296 |
| 5,903,823 A | * | 5/1999 | Moriyama et al. | 455/126 |
| 6,141,390 A | * | 10/2000 | Cova | 375/297 |

FOREIGN PATENT DOCUMENTS

| | | |
|---|---|---|
| JP | 06-077767 | 3/1994 |
| JP | 2001-267850 | 9/2001 |

* cited by examiner

*Primary Examiner*—Tesfaldet Bocure
(74) *Attorney, Agent, or Firm*—Hanify & King, P.C.

(57) ABSTRACT

To shorten the time required for writing of the distortion compensation coefficient and to reduce amount of data of the distortion compensation coefficient stored as the initial value of the distortion compensation apparatus. The distortion compensation apparatus for amplifying the transmitting signal after implementing the distortion compensation process comprises a coefficient memory for storing corresponding to each address the coefficient used for the distortion compensation process, an initial value memory for storing the initial value of the coefficient, and a controller for write control corresponding to n (n: natural number equal to 2 or larger) addresses of the coefficient read from the initial value memory corresponding to one address.

4 Claims, 5 Drawing Sheets

DISTORTION COMPENSATING APPARATUS, COMPRESSED DATA GENERATING METHOD

CROSS REFERENCE TO RELATED APPLICATION

This application is related to and claims priority to Japanese Application No. 2004-227511 filed Aug. 4, 2004 in the Japanese Patent Office, the contents of which are incorporated by reference herein.

BACKGROUND OF THE INVENTION

1. Field of the Invention

The present invention relates to a distortion compensating apparatus and a compressed data generating method, for example, a distortion compensating apparatus which may be suitably applied to a transmitting apparatus of a radio base station to be used for a mobile communication system.

2. Description of the Related Art

A radio base station used in the mobile communication system is provided with a distortion compensation apparatus for reducing distortion generated in a power amplifier in order to transmit a high power signal to mobile stations.

As the distortion compensating system, various methods have been proposed and a predistortion system is one example of such methods.

The predistortion system has been proposed to reduce distortion of the amplified signals by providing an inverse distortion characteristic for the distortion generated in the amplifier to the signal before input to the amplifier.

Here, since distortion generated in the amplifier changes in accordance with the input signal (particularly, input signal level), it is preferable that a coefficient (distortion compensation coefficient) for providing inverse distortion is specified by the input signal level and the input signal is then compensated on the basis of this coefficient.

Therefore, in the predistortion system, a look-up table (LUT) for storing the distortion compensation coefficients corresponding to the addresses generated from the input signal is used.

For this look-up table, the coefficients are written at high speed with an exclusive circuit considering activation of power supply and reset thereof as a trigger and all coefficients are completely set before start of operation.

Japanese Unexamined Patent Publication No. 2001-267850 discloses predistortion.

According to the background of the invention described above, the look-up table (LUT) of the distortion compensation apparatus is triggered by activation or reset of the power supply to write at a high speed the coefficients with the exclusive circuit.

However, when a large amount of distortion compensation coefficients are required to be written, a longer time is required until the completion of write. Particularly when it is attempted to perform the write process using a processor without use of the exclusive circuit, the distortion compensation coefficients must be read in the sequence of addresses for the write process. In this case, additional time is required.

SUMMARY OF THE INVENTION

It is therefore an object of the present invention to shorten the write time of the distortion compensation coefficients.

Moreover, it is another object of the present invention to reduce amount of data of the distortion compensation coefficients to be stored in the distortion compensation apparatus as the initial value.

In one embodiment of the present invention, a distortion compensation apparatus for implementing the distortion compensation process to the transmitting signal and then amplifying the signal, comprises a coefficient memory for storing, corresponding to each address, the coefficients used for the distortion compensation process, an initial value memory for storing the initial values of the coefficients, and a controller for write control, corresponding to n (n: natural number equal to 2 or larger) addresses, of the coefficients read corresponding to one address from the initial value memory.

Preferably the n is equal to m or smaller (m: natural number).

Preferably the coefficient memory stores the information about the number of addresses to be written repeatedly and the controller identifies n on the basis of the information and executes the write control.

In one embodiment of the present invention, a compressed data generating method comprises the steps of reading sequentially the master coefficient data which is the initial value of the distortion compensation coefficient, detecting that continuous n (n: natural number equal to 2 or larger) distortion compensation coefficients read out are approximately equal to each other, outputting both a selected compensation coefficient from among the continuous n distortion compensation coefficients and an instruction data instructing continuous write operations of n times of the selected compensation coefficient.

DETAILED DESCRIPTION OF THE PREFERRED EMBODIMENTS

The preferred embodiments of the present invention will be described with reference to the accompanying drawings.

[a]Description of the First Embodiment

In this embodiment, various methods are discussed for a way of writing the look-up table.

Distortion Compensation Apparatus

The distortion compensation apparatus of the present invention will be described with reference to FIG. 1.

Figure 1:
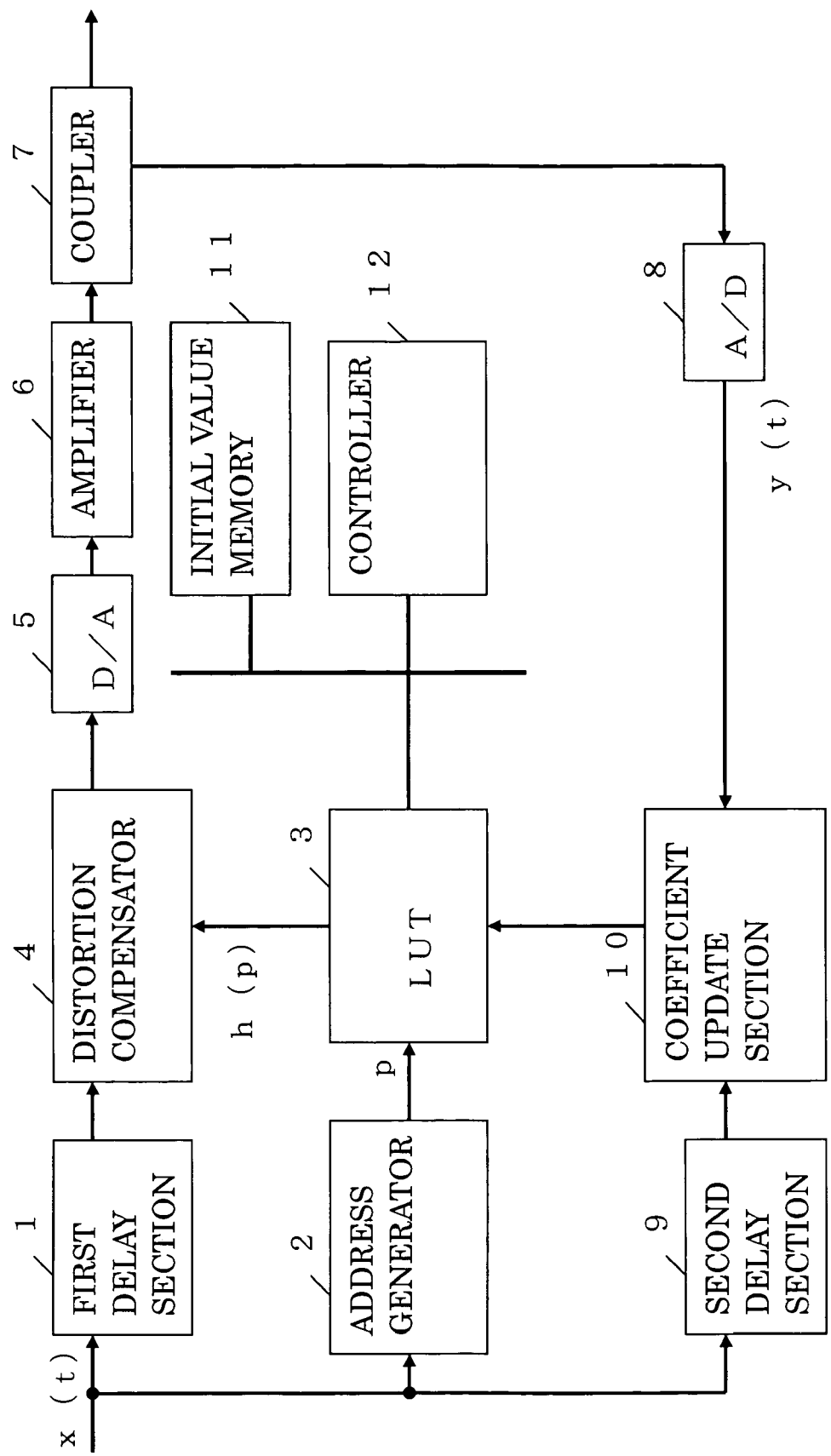
FIG. 1 shows the distortion compensation apparatus of the present invention.

FIG. 1 is a diagram illustrating the distortion compensation apparatus of the present invention. Such distortion compensation apparatus may be used as an amplifying unit for transmission in a radio base station used in the mobile communication system. This apparatus can also be adapted in general to a radio communication apparatus, in addition to the mobile communication.

In FIG. 1, numeral 1 designates a first delay section; 2, an address generator for outputting addresses in accordance with the input signal; 3, a coefficient memory (LUT) for storing distortion compensation coefficients used for the distortion compensation process; 4, a distortion compensator for executing predistortion using the distortion compensation coefficients; 5, a D/A converter; 6, an amplifier as the object of distortion compensation; 7, a coupler for extracting a part of the amplified signal as the feedback signal; 8, An A/D converter; 9, a second delay section for giving the predetermined delay; 10, a coefficient update section for updating the coefficients stored in the coefficient memory 3; 11, an initial value memory for storing the distortion compensation coefficients as the object to be stored in the coefficient memory 3; 12, a controller for controlling each block (for example, a processor is used).

Operation of Distortion Compensation Apparatus

Next, operation of the distortion compensation apparatus illustrated in FIG. 1 will be described.

The transmitting signal x(t) input to the distortion compensation apparatus is given the predetermined delay in the first delay section 1 and is then input to the distortion compensator 4. Here, the reason why the predetermined delay is given is that it is required to attain the time required to output the distortion compensation coefficient h(p) from the coefficient memory 3 based on the transmitting signal x(t).

Namely, x(t) is input to the address generator 2 to output the address p in accordance with the level thereof.

The coefficient memory 3 reads the distortion compensation coefficient stored in the address and gives it as h(p) to the distortion compensator 4.

The distortion compensation processor 4 executes predistortion to the transmitting signal x(t) by giving an inverse distortion characteristic to the distortion characteristic in the amplifier using the distortion compensation coefficient h(p) from the coefficient memory 3.

Namely, when the distortion characteristic of the amplifier 6 is assumed to be F(p) and linear amplifying coefficient is G, the linear amplification of the transmitting signal is expressed as $$y(t)=F(p) \times h(p) \times x(t) = G \cdot x(t)$$

By multiplying h(p) by the transmitting signal x(t).

The transmitting signal having completed the distortion compensation process in the distortion compensator 4, it is then converted to an analog signal in the D/A converter 5 and is then amplified by the amplifier 6.

Here, the larger the level of the transmitting signal is, the more the amount of distortion generated in the amplifier 6 is increased. However, since distortion of inverse characteristic is given in the distortion compensation processor 4, an output the amplifier becomes linear.

The amplified signal from the amplifier 6 is outputted as the transmitting signal but a part of this signal is extracted by the coupler 7 for use as a feedback signal.

Namely, the signal is converted to a digital signal with the A/D converter 8 and is then applied to the coefficient update section 10.

Since the transmitting signal x(t) and the signal obtained by delaying this signal in the second delay section 9 are simultaneously input to the coefficient update section 10, this coefficient update section 10 compares these two signals in order to update the coefficient in the coefficient memory 3.

Namely, if a deviation is generated in the distortion compensation coefficient in the coefficient memory 3, when the distortion compensation coefficient to be updated is assumed to be h'(p), it can be obtained from the following formula:

$$H'(p)=G \div F(p) = G \cdot x(t) \cdot h(p) \div y(t)$$

Accordingly, the coefficient can be updated by storing h'(p) after it is changed to the corresponding h(p).

As described above, the distortion compensation and amplifying apparatus illustrated in FIG. 1 is capable of conducting predistortion while the distortion compensation coefficient is updated using the feedback signal.

Compressed Data Writing Procedure

Next, the compressed data writing procedure to the initial value memory 11 will be described.

For the distortion compensation process, it is required to previously store the distortion compensation coefficient in accordance with the level of each transmitting signal in the coefficient memory 3.

However, it is impossible or is not preferable to use the stored contents of the coefficient memory 3 when the radio base station having this distortion compensation and amplifying apparatus is activated or when the distortion compensation amplifying unit is reset.

Therefore, in this case, a control (initial write) for reading the distortion compensation coefficient from the initial value memory 11 to store to the coefficient memory 3 is necessary.

Accordingly, it is important for the distortion compensating apparatus to previously store the initial value to the initial value memory 11. However, as described above, a considerable time is required for the process by the controller 12 to sequentially write the distortion compensation coefficient to the coefficient memory 3 by sequentially reading such coefficient from the initial value memory 11.

Therefore, in this embodiment, the transmission experiment is conducted using an apparatus similar to this distortion compensation and amplifying apparatus, highly accurate distortion compensation coefficient is stored as master coefficient data to the memory through update of the distortion compensation coefficient, and data compression is performed by reading this master coefficient data from the memory to store this data to the initial value memory 11.

Figure 2:
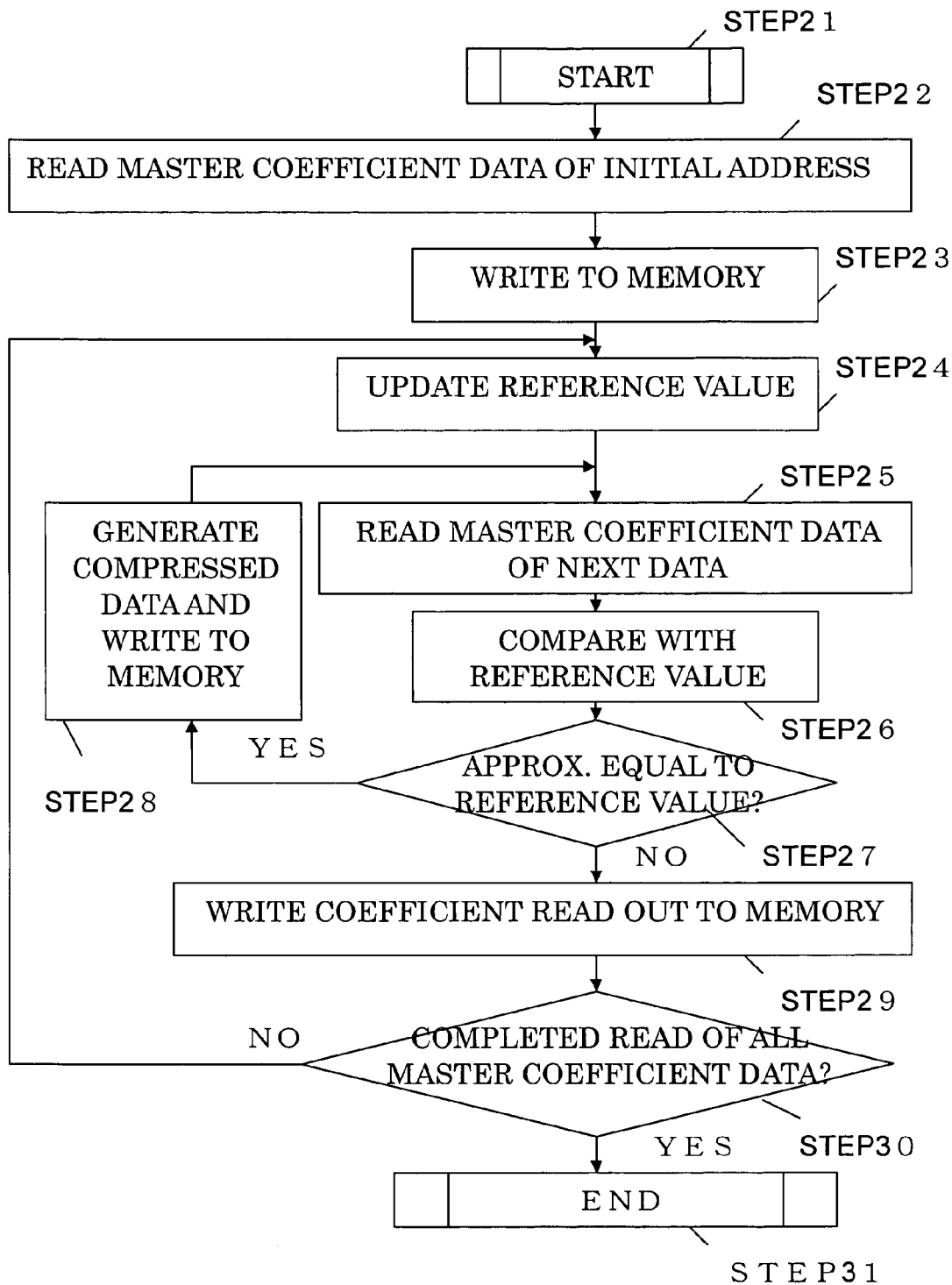
FIG. 2 shows the compressed data writing procedure of the present invention.

FIG. 2 is a diagram illustrating the write procedure of the compressed data.

First, when the write is started (step 21) the master coefficient data of the initial (starting) address is read from the memory (step 22). This read control may be realized with the controller 12 but it can be done also with the processor of an external apparatus by connecting the external apparatus to the distortion compensation and amplifying apparatus. Here, in any case, the term, "processor" is used.

Next, the coefficient data read out from the memory is stored into the initial (starting) address of the initial value memory 11 (memory).

The processor stores the coefficient stored in the initial value memory 11 to use it as the reference value for identifying the data as the object of compression (step 24).

In step 25, the master coefficient data of the address next to the initial (starting) address is read from the memory and it is then compared with the reference value stored in the processor (step 26).

It is then judged as a result of comparison whether the data is approximately equal to the reference value or not (step 27). When it is determined that the data is approximately equal to the reference value, the process goes to step 28. If not approximately equal, the process goes to step 29.

Various methods are considered for determining approximately equal. For example, it is determined when the value obtained by division with the reference value enters a predetermined range or when difference from the reference value is within a predetermined range.

When it is determined that the data is not approximately equal to the reference value, the coefficient is read out in step 29 and is stored to the next address of the initial value memory 11, and the process goes to step 30.

In step 30, it is determined whether the read operations of all master coefficient data to be stored have been completed or not. When completed, the process goes to step 31. If not completed, the reference value is updated by the distortion compensation coefficient stored in the initial value memory 11 as the new reference value (step 24). The subsequent processes are conducted as already described above.

When the data is determined to be approximated to the reference value in step 27, the process goes to step 28. Here, the compressed data is generated and this compressed data is written, in the initial value memory 11, to the subsequent address of the address to which the data was written previously.

Figure 3:
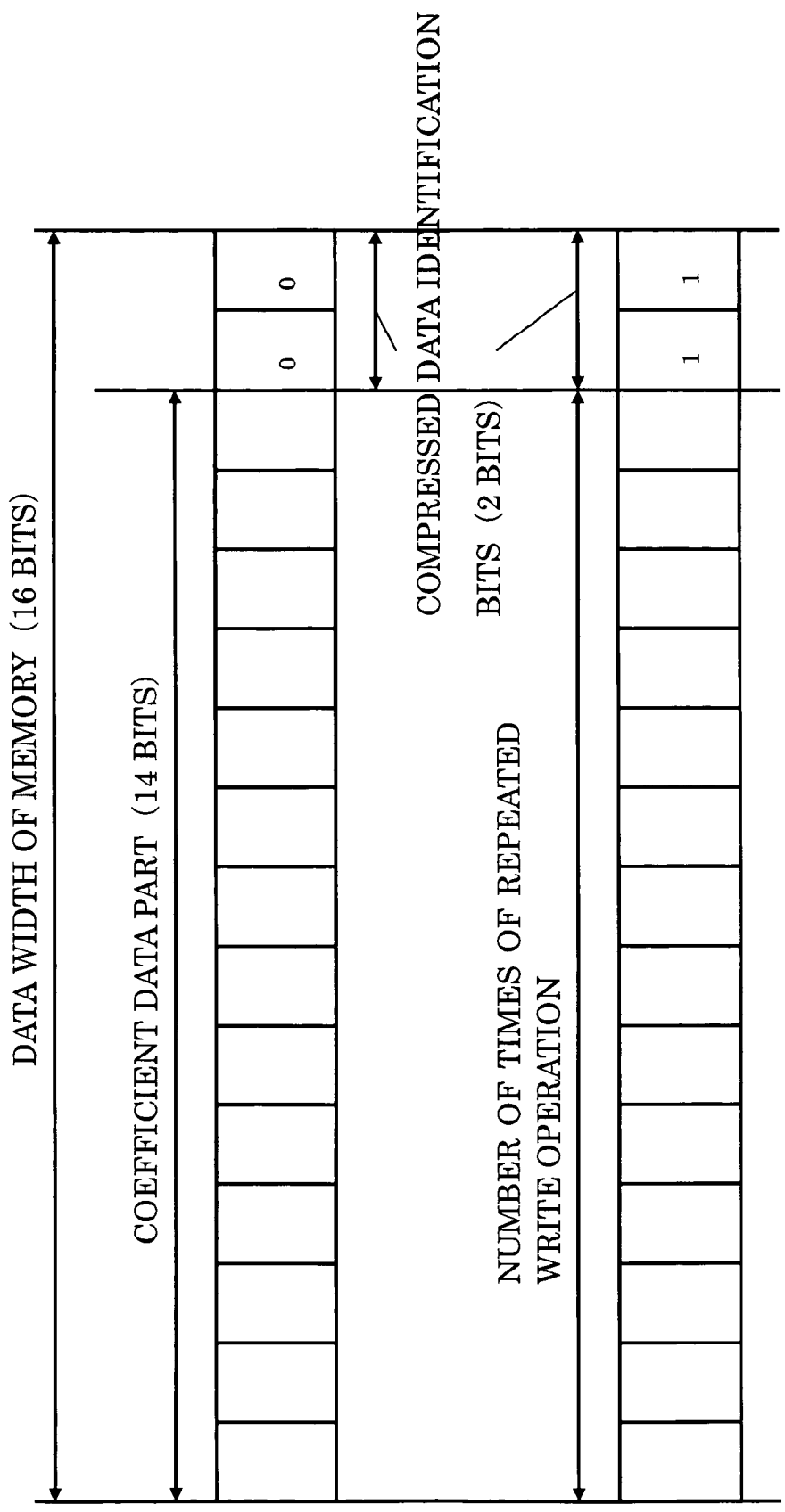
FIG. 3 shows the compressed data format of the present invention.

FIG. 3 is a diagram showing the compressed data format.

When the data width to be stored to one address in the initial value memory 11 is assumed to be 16 bits, the ordinary coefficient data (see upper portion of figure) is formed of 14 bits and the subsequent two bits are used as the compressed data identification bits.

Accordingly, as the coefficient data written in step 29, the bits indicating no compressed data are written into the compressed data identification bits (when the bit indicating compressed data is 11, the other bits, for example, 00 is written as no compressed data).

Meanwhile, the data written in step 28 becomes the data illustrated in the lower portion of the figure. In this data, the bits (here, 11) indicating that the compressed data identification bit is the compressed data is set and is then stored in the initial value memory 11.

In order to identify the number of times of repeated write operations, it is required to count up the number of times in which the data has been continuously determined to be approximately equal to the reference value.

It is preferable that the processor adds one (1) to the number of times of repeated write operations and stores this value each time when the process goes to the step 28.

Namely, when approximation to the reference value is determined first in step 27, the 16 bits in total are stored to the initial value memory 11 by adding the compressed data identification bit "11" to 1 ("00000000000001" to be exact) which is the number of times of the repeated write operation.

Next, when continuous approximation to the reference value is determined in the step 27, the number of times of repeated write operations is updated to 2 ("00000000000010" to be exact) by further adding 1 and moreover the compressed data identification bit is added for storing into the initial value memory 11 in order to update the previously stored compressed data, namely the previously stored compressed data is overwritten. In the manner described above, the number of times of repeated write operation is counted up.

The value to be counted up may be limited to m or less (m: natural number) in view of preventing the data from being unnecessarily compressed.

Moreover, in this example, the coefficient data part is limited to 14 bits and the remaining two bits are assigned exclusively for the compressed data identification bits. It is more preferable for effective use of bits that the coefficient data part is defined as 16 bits and when the lower two bits of the coefficient data become 11, it is converted to 10 for the write operation.

Here, the least significant bit changes through the conversion but it is considered as the change which is almost equal to the change in the range assumed as approximately equal as described above or as a sufficiently small change. Therefore, the influence of error in the bit conversion applied to the distortion compensation coefficient is assumed to be sufficiently small for the data compression.

A suitable example when the initial value memory 11 uses a electrically erasable and programmable memory (for example, EEPROM) has been described above. However, when a flash memory, which does not always allow programming is used, the control for generating the compressed data and then writing to the memory is not conducted in step 28 and the controller 12 performs, in place of the control, a process to count up the number of times of repeat.

When NO is determined in step 27, the compressed data is generated by setting the count value counted up with the controller 12 to the coefficient data part (14 bits) and setting 11 (bits indicating the compressed data) to the lower two bits, and this compressed data is written to the next address of the initial value memory 11 which is already storing the distortion compensation coefficient. Moreover, the compressed data is then written into the initial value memory 11 using the master coefficient data read out in step 25 as the next address.

Accordingly, over-write is no longer required and the compressed data can also be written easily to the memory which does not allow over-writing.

In addition, when NO is determined in step 27 while the count value is 1, the compressed data is not stored into the initial value memory 11 but the reference value stored in the controller 12 may be stored directly to the initial value memory 11 as the distortion compensation coefficient.

Compressed Data Development Procedure

Next, the procedure for developing the compressed data stored in the initial value memory 11 will then be described with reference to FIG. 4.

Figure 4:
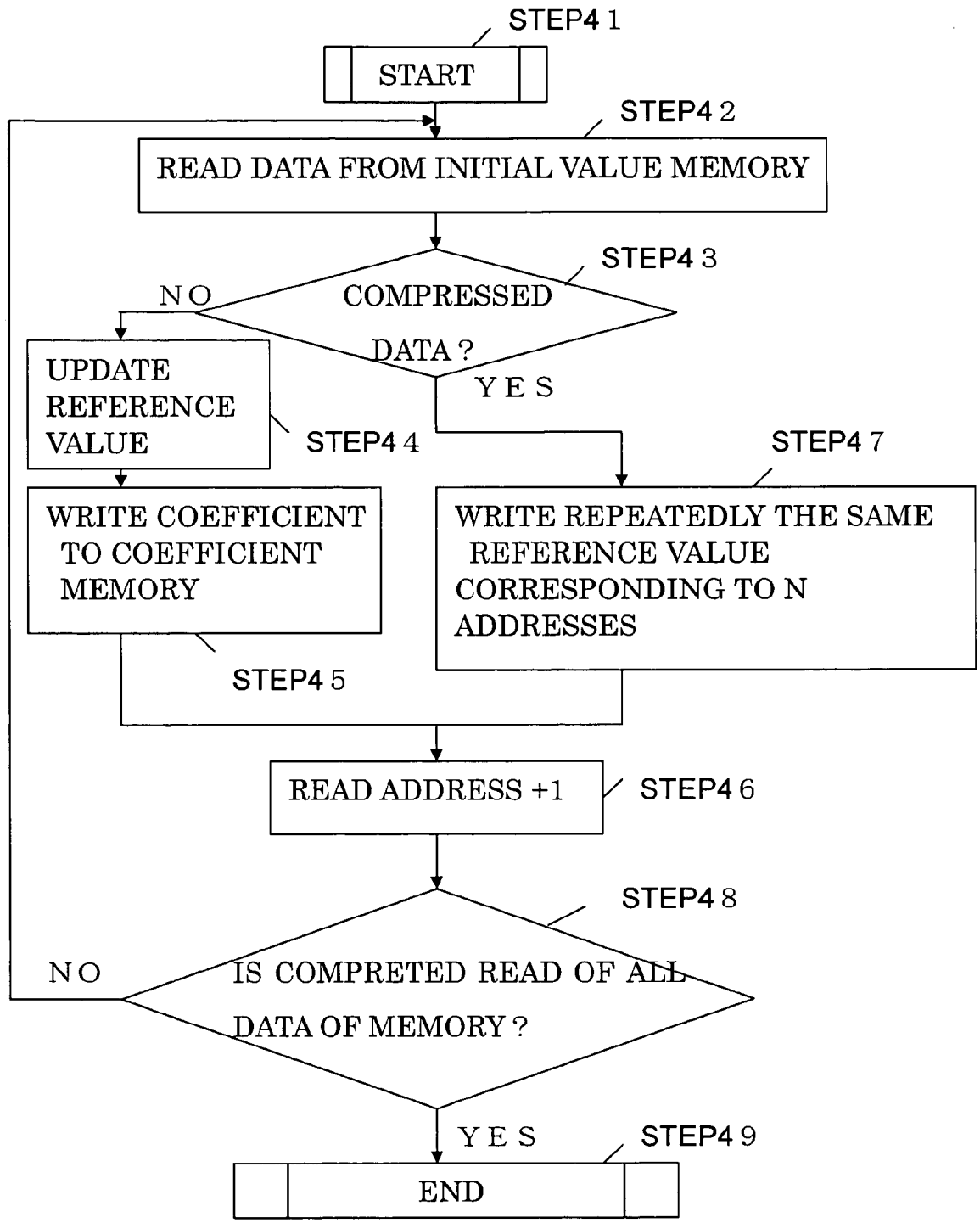
FIG. 4 shows the compressed data development procedure of the present invention.

FIG. 4 is a diagram illustrating the procedure for developing the compressed data. The development process is executed by the controller 12 of the distortion compensation amplifying apparatus.

When the development procedure is started (step 41), the controller 12 reads the distortion compensation coefficient using the initial address from the initial value memory (step 42).

The compressed data or no compressed data is determined using the compressed data identification bits added to the data read out (step 43). When no compressed data is detected (the compressed data identification bits are not 11), the process goes to step 44. When compressed data is detected (the compressed data identification bits are 11), the process goes to step 47.

When the data is read first, it means that the data is not the compressed data. Therefore, the process goes to step 44 and the distortion compensation coefficient read out is stored as the reference value to an internal register of the controller 12 (step 44).

The distortion compensation coefficient read out is then written to the initial address of the coefficient memory 3 (step 45). When the lower two bits are used only as the compressed data identification bits, it is preferable that the distortion compensation coefficient of at least the upper 14 bits are stored. When the lower two bits are not used only as the compressed data identification bits, it is preferable that the 16 bits as a whole are stored as the distortion compensation coefficient.

After going to step 46, one (1) is added to the read address which is used for reading the next distortion compensation coefficient from the initial value memory 11 (set to the next read address).

In step 48, whether all data of the initial value memory 11 have been read or not is determined by determining whether the updated read address reaches to the ((total address to be read) +1) or not. When read operations of all data in the initial value memory 11 have been completed, the process goes to step 49 for termination.

Meanwhile, when the read operations are not yet completed, the next distortion compensation coefficient is read from the initial value memory 11 in accordance with the updated read address (step 42). The subsequent processes are identical to those described above.

It is preferable in the procedure for writing the compressed data in FIG. 2 that the controller 12 can store the final address because the processor notifies thereto the final address written into the initial value memory 11. Of course, it is possible that the final address is indicated to the controller 12 for storing.

It is required for the controller 12 to recognize the reference address for completing the read operation because the final address varies in accordance with the level of compression.

When the compressed data is determined in step 43 (the compressed data identification bits are 11), the process goes to step 47.

In step 47, the number of times n of repeated write operation is identified by recognizing the number of times of repeated write operation indicated in the upper bits of the compressed data (it is effective when n is equal to 2 or larger).

The reference value stored in step 44 is written repeatedly to the n addresses following the address just previously stored in the coefficient memory 3.

Accordingly, since a read operation is no longer required for each write operation from the initial value memory while the write operations are conducted continuously, the number of times of read operations may be reduced. Therefore, high speed write of the distortion compensation coefficient can be executed to the coefficient memory 3.

Finally, distortion compensation coefficient as the object of the compressed write operation will be described with reference to FIG. 5.

Figure 5:
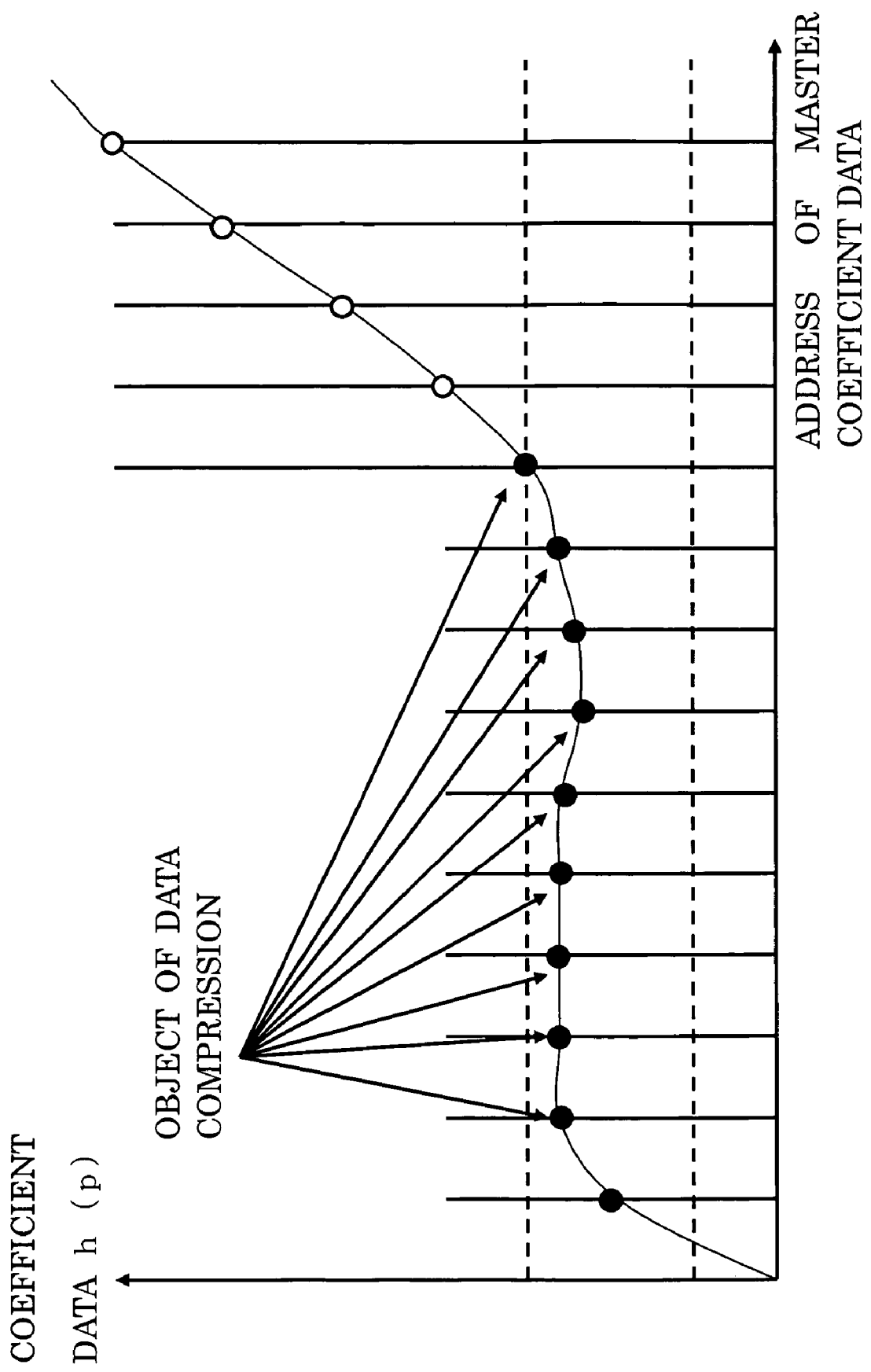
FIG. 5 is a diagram showing the object of the compressed writing of data.

In FIG. 5, the horizontal axis indicates the addresses of the master coefficient data, while the vertical axis, the coefficient data h(p).

As illustrated in FIG. 5, the black circles up to the 10th circle from the 2nd circle from the left side are objects of the data compression because the difference from the coefficient value indicated by the first black circle is within the predetermined difference.

However, the white circles after the 11th circle from the left side is outside of the object of data compression because difference from the preceding distortion compensation coefficient is not within the predetermined difference.

In this case, as described above, for the first black circle from the left side, the distortion compensation coefficient is stored, for the second to 10th black circles from the left side, the number of times of repeated write operations indicating repeated storing of the value identical to the above distortion compensation coefficient is written as 9 and the compressed data to which the compressed data identification bits are set to 11 is stored to the next address of the distortion compensation coefficient.

According to the distortion compensation apparatus of the present invention, the write time of the distortion compensation coefficient can be shortened.

Moreover, according to the compressed data generating method of the present invention, amount of data of the distortion compensation coefficient to be stored as the initial value to the distortion compensation apparatus can be reduced.

What is claimed is:

1. A distortion compensating apparatus for a transmitted signal, comprising
    a coefficient memory operable to store a coefficient used for distortion compensation in each address,
    an initial value memory operable to store an initial value of the coefficient, and
    a controller operable to write the coefficient read from one address of the initial value memory to a plurality of addresses of the coefficient memory.

2. The distortion compensating apparatus according to claim 1, wherein the number of the plurality of addresses is less than a threshold number.

3. The distortion compensating apparatus according to claim 1, wherein the initial value memory is operable to store the number of the plurality of addresses and the controller performs writing based on the stored number of the plurality of addresses.

4. A compressed data generating method comprising the steps of:
    reading an initial value of a distortion compensation coefficient,
    detecting that a plurality of distortion compensation coefficients read out are approximately equal to each other, and
    outputting both a selected compensation coefficient from among the plurality of coefficients and an instruction data instructing the selected compensation coefficient to be written a number of times equal to the number of the plurality of coefficients.

* * * * *